(12) United States Patent
Hsieh (10) Patent No.: US 8,309,378 B2
(45) Date of Patent: *Nov. 13, 2012

(54) METHOD OF FABRICATING A LIGHT EMITTING DIODE CHIP HAVING PHOSPHOR COATING LAYER

(75) Inventor: Chung-Chuan Hsieh, Tucheng (TW)

(73) Assignee: Everlight Electronics Co., Ltd., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/229,994

(22) Filed: Sep. 12, 2011

(65) Prior Publication Data

US 2012/0003758 A1    Jan. 5, 2012

Related U.S. Application Data

(63) Continuation of application No. 12/729,721, filed on Mar. 23, 2010, now Pat. No. 8,030,105.

(30) Foreign Application Priority Data

Mar. 18, 2010    (TW) .............................. 99108042 A (51) Int. Cl.
  *H01L 21/00* (2006.01)
(52) U.S. Cl. .................. 438/29; 257/E21.499; 438/110; 438/113
(58) Field of Classification Search ........... 257/E21.499; 438/29, 110, 113
See application file for complete search history.

(56) References Cited

U.S. PATENT DOCUMENTS

| | | | |
|---|---|---|---|
| 6,630,691 B1 | 10/2003 | Mueller-Mach et al. | |
| 6,696,703 B2 | 2/2004 | Mueller-Mach et al. | |
| 6,746,889 B1 | 6/2004 | Eliashevich et al. | |
| 7,195,944 B2 | 3/2007 | Tran et al. | |
| 7,301,175 B2 | 11/2007 | Izuno et al. | |
| 7,361,938 B2 | 4/2008 | Mueller et al. | |
| 7,589,358 B2 | 9/2009 | Dwilinski et al. | |
| 7,718,449 B2 | 5/2010 | Gao et al. | |
| 8,030,105 B1 * | 10/2011 | Hsieh .............................. | 438/29 |
| 2006/0003477 A1 | 1/2006 | Braune et al. | |
| 2006/0261364 A1 | 11/2006 | Suehiro et al. | |
| 2006/0284207 A1 | 12/2006 | Park et al. | |
| 2008/0029780 A1 | 2/2008 | Ohtsuka et al. | |
| 2008/0121911 A1 * | 5/2008 | Andrews et al. ................ | 257/98 |
| 2008/0173884 A1 | 7/2008 | Chitnis et al. | |
| 2008/0179611 A1 | 7/2008 | Chitnis et al. | |
| 2009/0057690 A1 | 3/2009 | Chakraborty | |
| 2009/0065790 A1 | 3/2009 | Chitnis et al. | |
| 2009/0197361 A1 | 8/2009 | Braune et al. | |
| 2009/0256163 A1 | 10/2009 | Chakraborty | |
| 2010/0081220 A1 | 4/2010 | Cheng et al. | |

FOREIGN PATENT DOCUMENTS

| | | |
|---|---|---|
| JP | 2000-173954 | 6/2000 |
| JP | 3589187 B2 | 4/2002 |
| TW | 200704610 | 2/2007 |

\* cited by examiner

*Primary Examiner* — Asok Sarkar (74) *Attorney, Agent, or Firm* — Andy M. Han; Han IP Law PLLC (57) ABSTRACT

A method of fabricating light emitting diode chips having a phosphor coating layer comprises providing a substrate having a plurality of light emitting diodes formed thereon; forming a conductive bump on at least one of the plurality of light emitting diodes; forming a phosphor coating layer over the substrate and the light emitting diodes; cutting the phosphor coating layer by a point cutter to remove an upper portion of the phosphor coating layer, so as to reduce a thickness of the phosphor coating layer and expose the conductive bump; and forming a plurality of individual light emitting diode chips having the phosphor coating layer by separating the plurality of light emitting diodes.

11 Claims, 7 Drawing Sheets

METHOD OF FABRICATING A LIGHT EMITTING DIODE CHIP HAVING PHOSPHOR COATING LAYER

RELATED APPLICATIONS

This application is a continuation of application Ser. No. 12/729,721, filed Mar. 23, 2010 now U.S. Pat. No. 8,030,105, which is based upon and claims the benefit of priority to Taiwan Patent Application No. 099108042, filed Mar. 18, 2010, the entire content of both of which are incorporated by reference herein in their entirety.

TECHNOLOGY FIELD

The present invention relates to a method of fabricating a light emitting diode chip, and particularly to a method of fabricating a light emitting diode chip having a uniform phosphor coating layer.

BACKGROUND

Due to their long lifetime, small size, high resistance to shock and vibration, low heat generation, and low power consumption, light emitting diodes (LEDs) have been widely used in display or as light source in various consumer electronic devices, electrical appliances, and apparatuses. Recently, multi-color and high brightness LEDs have also been used in out-door large-screen displays, traffic lights, etc. In the future, LEDs may act as the major illumination light source, with the advantages of energy saving as well as environment protection.

Figure 1:
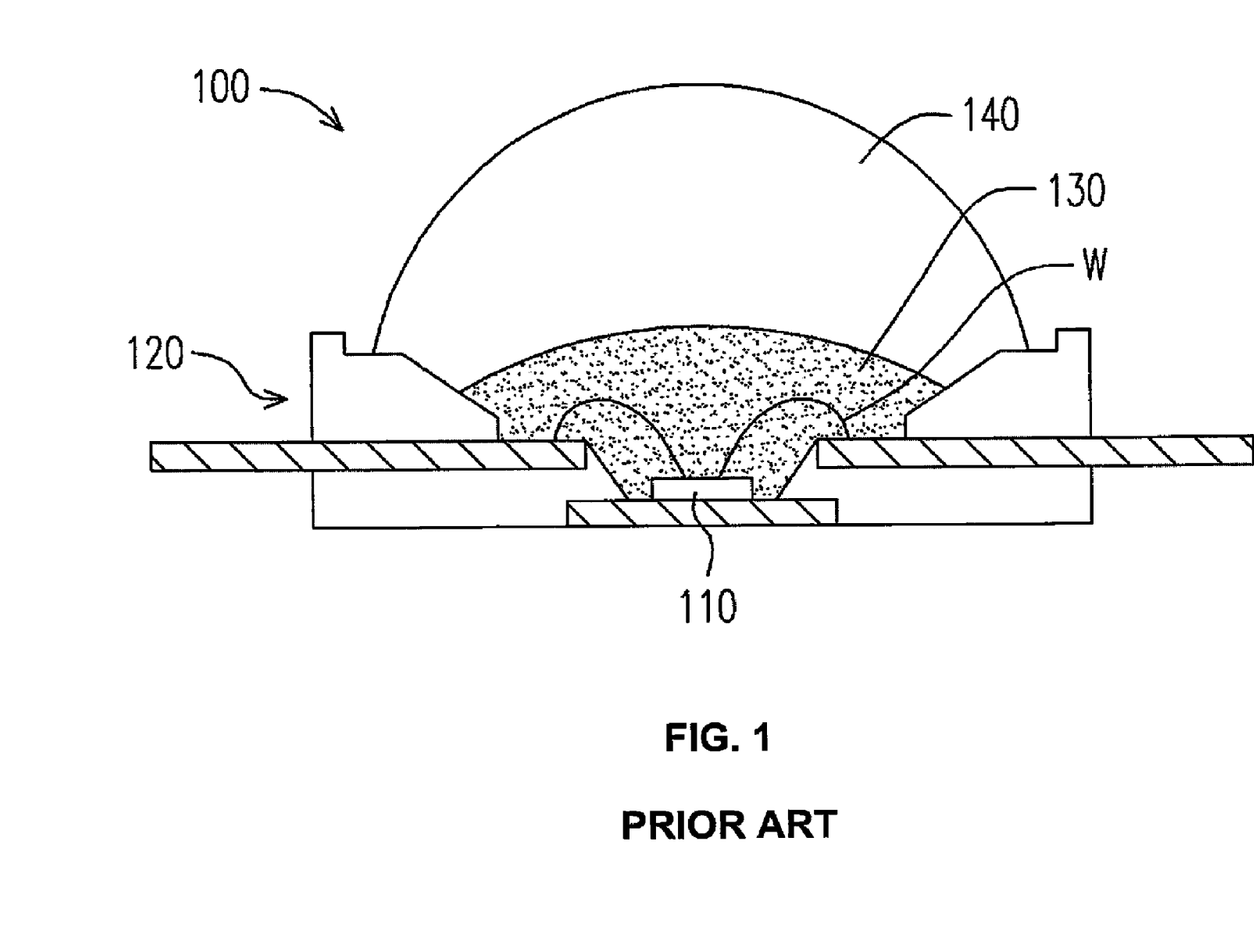
FIG. 1 is a cross-sectional view showing a prior art white light emitting diode.

One common type of LED is the white LED, which is capable of emitting white light. Different approaches can be implemented to realize white light emitting from an LED. One approach is to use the combination of a blue LED chip and yellow phosphor. FIG. 1 shows the cross-sectional view of a prior art white LED. The conventional white LED 100 shown in FIG. 1 comprises a blue LED chip 110 arranged on a base 120. The blue LED chip 110 is electrically connected to the base 120 by electrical wires W. A yellow phosphor resin 130 is formed to cover the blue LED chip 110 and the wires W by dispensing, for example. A lens 140 is formed over the yellow phosphor resin 130. The blue light emitted by the blue LED chip 110 is partially absorbed by the yellow phosphor powders in the yellow phosphor resin 130 and converted to yellow light. Unabsorbed blue light mixes with the yellow light so as to generate a white light.

However, there are problems with such convention LEDs in that it is often difficult for the yellow phosphor resin 130 formed by dispensing to evenly cover the LED chip. A thicker portion of the yellow phosphor resin 130 absorbs more blue light and emits more yellow light than a thinner portion. Accordingly, it is difficult for such an LED 100 to emit light with uniform color. For example, while it may be possible to realize white light in the center portion of the yellow phosphor resin 130, light emitted from other portion of the yellow phosphor resin 130 may undesirably appear yellowish.

SUMMARY

In the following description, certain aspects and embodiments will become evident. It should be understood that the aspects and embodiments, in their broadest sense, could be practiced without having one or more features of these aspects or embodiments. Thus, it should be understood that these aspects and embodiments are merely exemplary and not restrictive.

In accordance with one aspect of the disclosure describing embodiments of the present invention, there is provided a method of fabricating light emitting diode chips having a phosphor coating layer. In the fabrication method, a substrate is provided having a plurality of light emitting diodes formed thereon. A conductive bump is formed on at least one of the plurality of light emitting diodes. A phosphor coating layer is formed over the substrate and the light emitting diodes and is cut by a point cutter to remove an upper portion of the phosphor coating layer, so as to reduce a thickness of the phosphor coating layer and expose the conductive bump. A plurality of individual light emitting diode chips having the phosphor coating layer are formed by separating the plurality of light emitting diodes.

Features and advantages consistent with the invention will be set forth in part in the description which follows, and in part will be obvious from the description, or may be learned by practice of the invention. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DETAILED DESCRIPTION

Embodiments consistent with the invention include methods of fabricating one or more light emitting diode chips having a uniform phosphor coating layer. Hereinafter, embodiments consistent with the present invention will be described with reference to the drawings. Wherever possible, the same reference numbers will be used throughout the drawings to refer to the same or like parts.

Figure 2A:
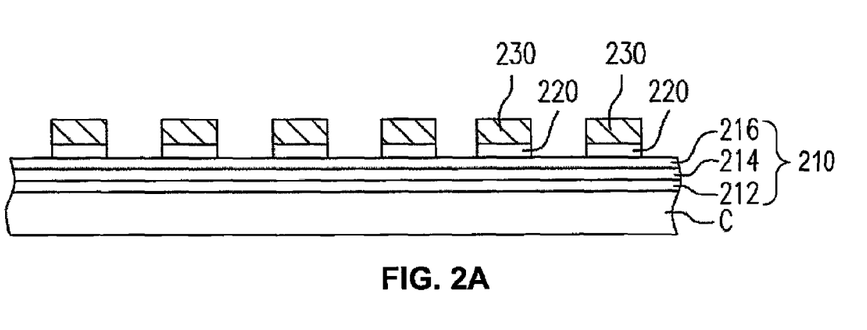
FIGS. 2A-2E are cross-sectional views showing an exemplary process of fabricating light emitting diode chips according to one embodiment of the invention.

FIGS. 2A-2E show an exemplary process of fabricating one or more light emitting diode chips according to one embodiment of the invention. Referring now to FIG. 2A, an exemplary substrate C is first provided. A light emitting unit 210 is formed over the substrate C. The light emitting unit 210 may comprise a first semiconductor layer 212 with a first conductivity type, a light emitting layer 214, and a second semiconductor layer 216 with a second conductivity type.

The light emitting layer 214 may be sandwiched between the first semiconductor layer 212 and the second semiconductor layer 216. The substrate C may be made of, for example, silicon carbide (SiC), silicon (Si), sapphire, zinc oxide (ZnO), gallium arsenide (GaAs), spinelle ($MgAl_2O_4$), or metal (such as copper). A plurality of electrodes 220 are formed on the second semiconductor layer 216 and a plurality of conductive bumps 230 are then formed on the electrodes 220. The conductive bumps may be made of, for example, gold (Au) or gold alloy.

Figure 2B:
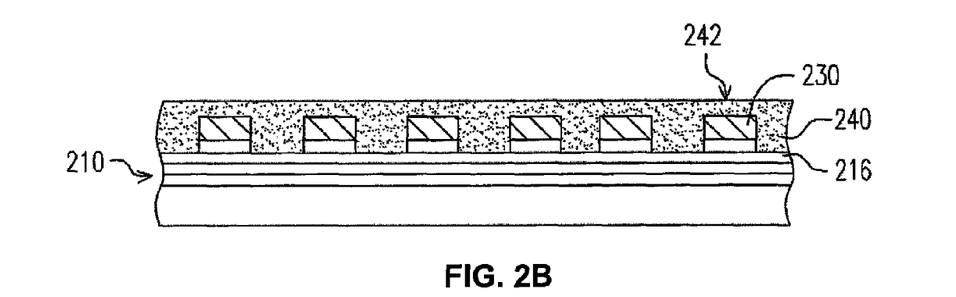

Referring now to FIG. 2B, a phosphor coating layer 240 is formed over the second semiconductor layer 216 and the conductive bumps 230. The phosphor coating layer 240 may cover the conductive bumps 230. In some embodiments, the phosphor coating layer 240 may be formed by, for example, transfer molding, compressing molding, screen printing, spin coating, dispensing, electrophoresis, spray coating, or any other suitable methods. In one embodiment, the phosphor coating layer 240 may be a mixture of at least one type of phosphor powder and a resin. The resin may be, for example, silicone or epoxy resin.

Figure 2C:
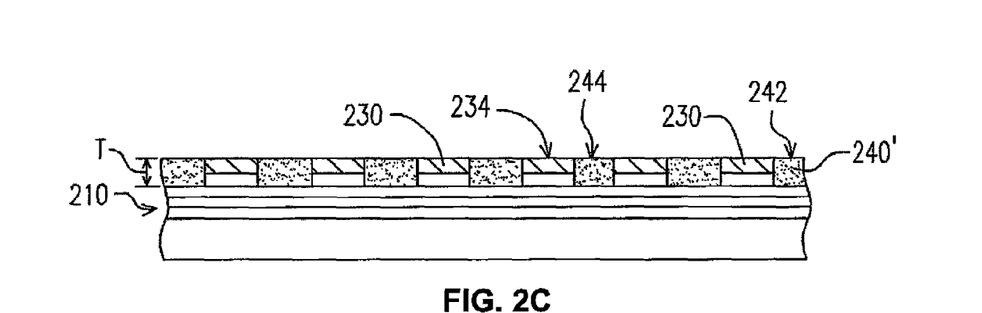

After forming the phosphor coating layer 240 over the second semiconductor layer 216 and the conductive bumps 230, the phosphor coating layer 240 may be subjected to curing. Then, as shown in FIG. 2C, an upper portion of the cured phosphor coating layer 240' is removed by cutting the phosphor coating layer 240' using a point cutter, e.g., a diamond cutter or a Tungsten Carbide(WC) cutter (not shown), to reduce the thickness of the cured phosphor coating layer 240' so that the conductive bumps 230 are exposed. The conductive bumps 230 are exposed so as to facilitate the subsequent wire bonding process. It is to be noted that the step of cutting the phosphor coating layer 240' may be performed multiple times. After each cutting step, the wafer may be checked to see whether the conductive bumps 230 are exposed. If the conductive bumps 230 are not exposed, the cutting step is repeated. Such procedure may be repeatedly performed until the conductive bumps 230 are exposed.

Figure 3A:
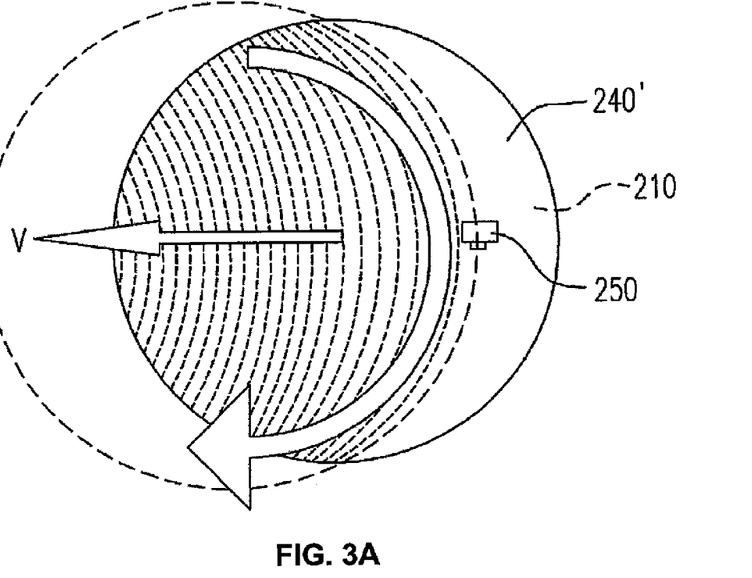
FIGS. 3A-3B are a plan view and a side view, respectively, illustrating the rotating direction of the diamond cutter and the moving direction of the semiconductor wafer during the cutting step shown in FIG. 2C.
Figure 3B:
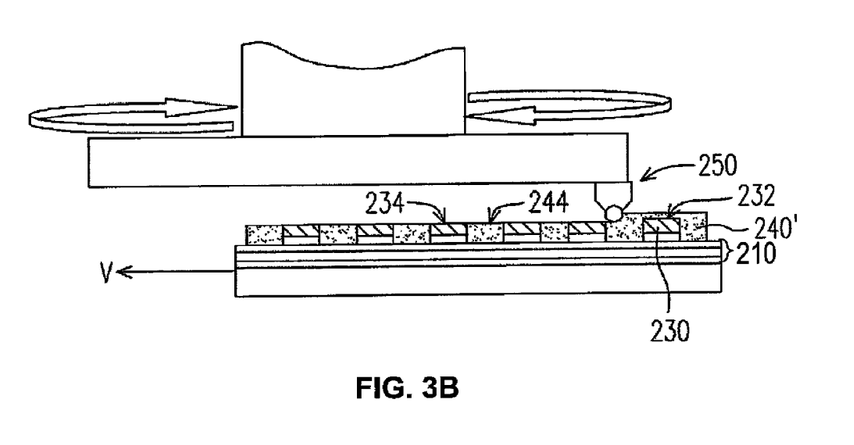

Referring now to FIGS. 3A and 3B, a plan view and a side view, respectively, of the phosphor coating layer 240' of FIG. 2C are shown to illustrate how the diamond cutter moves relative to the semiconductor wafer during cutting of the phosphor coating layer 240'. In one embodiment, when cutting the phosphor coating layer 240', the diamond cutter 250 may rotate clockwise about a rotation axis in the vertical direction. The wafer may move relative to the diamond cutter 250 in the horizontal direction indicated by V. However, the rotation direction of the diamond cutter 250 and the moving direction of the wafer are not limited to those described above. For example, the diamond cutter 250 may also rotate counter-clockwise. In some embodiments, the diamond cutter 250 may also cut the conductive bumps 230, and in the meantime, an upper portion of the conductive bumps 230 is removed.

It is to be noted that, in a conventional chemical mechanical polishing method, polishing slurry comprising abrading particles and a polishing pad having abrading particles are needed. During polishing, the polishing slurry and the material polished from the polishing surface cannot be removed instantaneously. Therefore, when a chemical mechanical polishing method is used to polish the phosphor coating layer, it is difficult to keep the upper surface of the phosphor coating layer at the same level as the upper surface of the conductive bumps due to the different degree of hardness between the phosphor coating layer and the conductive bumps. On the other hand, consistent with an embodiment and principles of the present invention, the diamond cutter 250 may cut the phosphor coating layer 240' and the conductive bumps 230 at the same time, and may push away the material cut from the phosphor coating layer 240' and/or that cut from the conductive bumps 230 immediately. In such a manner, the upper surface of the phosphor coating layer 240' and that of the conductive bumps 230 may be kept at the same height level after the cutting step, as shown in FIGS. 2C-2E and 3B.

Consistent with an embodiment and principles of the present invention, the diamond cutter 250 cuts the phosphor in the horizontal direction. Therefore, the phosphor layer 240' after cutting has a substantially uniform thickness, which may be about 5 μm to about 40 μm. For example, the thickness of the phosphor layer 240' after cutting may be about 30 μm.

Due to the rotation of the diamond cutter 250, the tip of the diamond cutter moves in a circle when cutting the phosphor coating layer 240', and then forming a curved cutting line on the surface of the wafer as shown in FIG. 3. In addition, since the wafer moves relative to the diamond cutter 250 in the direction V, the cutting line is then expanded to a cutting surface, so that the entire phosphor coating layer 240' is subjected to cutting and an upper portion of the entire phosphor coating layer 240' may be removed by the cutting step. The surface 244 of the phosphor coating layer 240' after cutting may have regular patterns. These patterns may help to reduce the total reflection of the light emitted from the light emitting layer 214 and/or that emitted by the phosphor coating layer 240 at the surface 244 of the phosphor coating layer 240', and thus may improve the extraction efficiency.

Figure 2D:
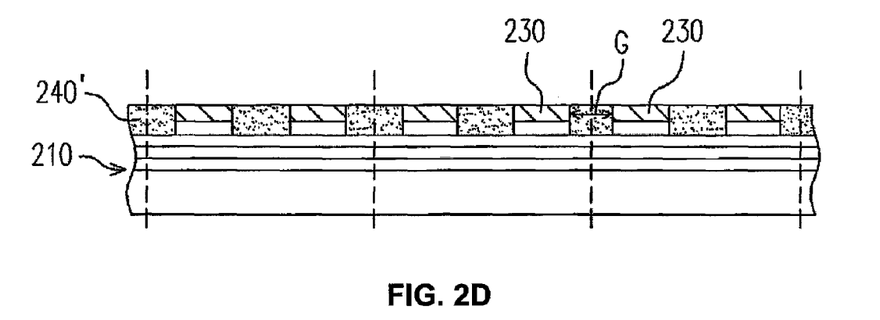
Figure 2E:
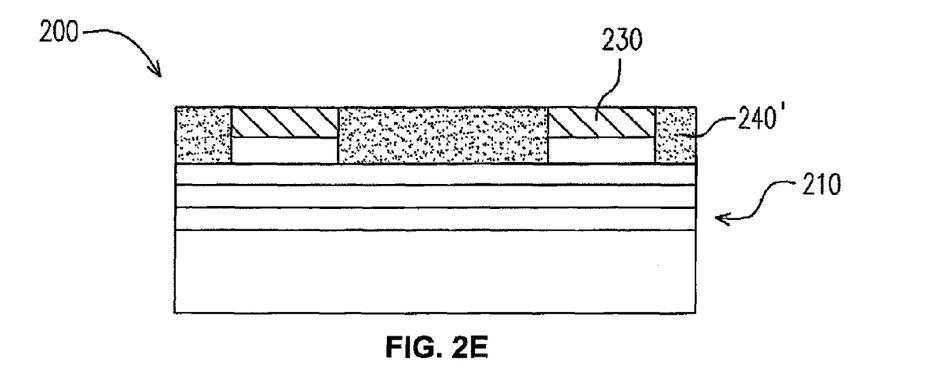

Referring now to FIG. 2D, a plurality of individual light emitting diode chips 200 having a phosphor coating layer 240' may be formed by cutting or otherwise separating the phosphor coating layer 240', the light emitting unit 210, and the substrate C along the vertical dashed lines in the spaces G between the conductive bumps 230. Such separating may be accomplished via, for example, dicing with a blade or laser cutting. FIG. 2E is an enlarged view showing such a light emitting diode chip 200 after the separating step. The light emitting diode chip 200 shown in FIG. 2E comprises two conductive bumps. However, it is noted that the number of conductive bumps comprised in one light emitting diode chip may not be limited to two. A light emitting diode chip consistent with an embodiment and principles of the present invention may comprise, e.g., one, three, or more conductive bumps. A larger light emitting diode chip may have more conductive bumps, so that uniformity of the current distribution may be improved.

Consistent with principles of the present invention, different equipment may be used to dice the phosphor coating layer 240', the light emitting unit 210, and the substrate C. For example, the phosphor coating layer 240', the light emitting unit 210, and the substrate C may be diced using a blade. Alternatively, the phosphor coating layer 240' and the light emitting unit 210 may be diced using a blade, and the substrate C may be diced using a laser. As another alternative, the phosphor coating layer 240', the light emitting unit 210, and the substrate C may be diced using a laser.

Consistent with principles of the present invention, since the phosphor coating layer 240' is first formed over the light emitting unit 210 and then cutting is performed on the phosphor coating layer 240' to reduce its thickness, the phosphor coating layer may be controlled to form only on the upper surface of the light emitting unit 210. Moreover, the thickness of the phosphor coating layer formed on the upper surface of the light emitting unit may have a substantially uniform thickness. Therefore, the light emitted by the light emitting diode chip in an embodiment of the invention may have better uniformity. That is, uniform white color may be emitted from the entire upper surface of the phosphor coating layer of the light emitting diode chip.

FIGS. 4A-4E show an exemplary process of fabricating light emitting diode chips according to another embodiment of the invention. FIG. 5 is an enlarged view of a light emitting diode shown in FIG. 4A.

Figure 4A:
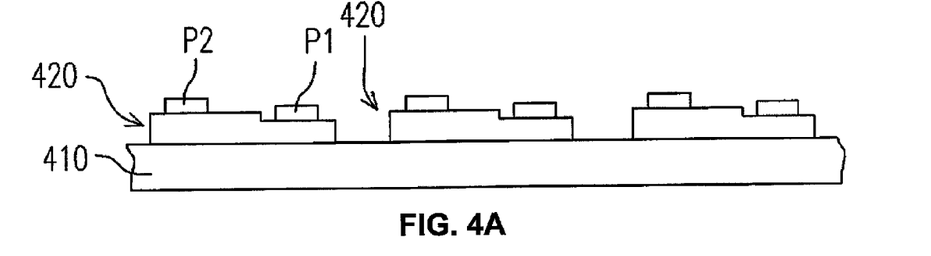
FIGS. 4A-4E are cross-sectional views showing an exemplary process of fabricating light emitting diode chips according to another embodiment of the invention.
Figure 5:
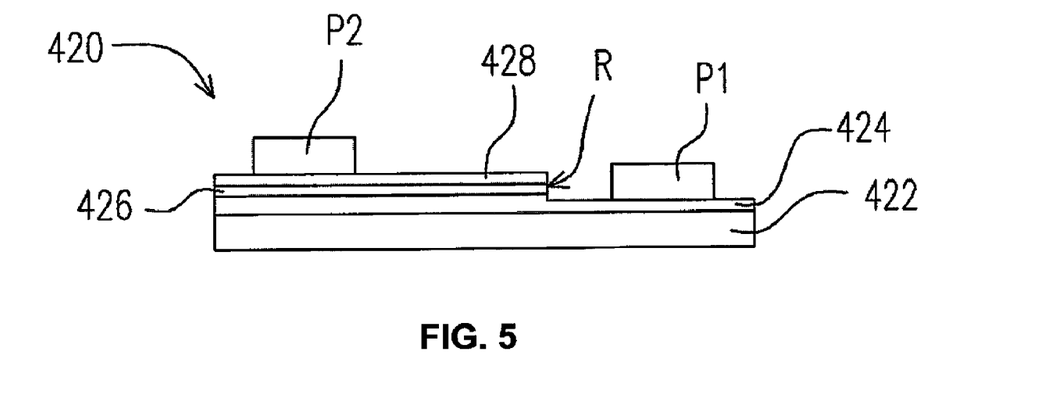
FIG. 5 is a enlarged view illustrating an exemplary light emitting diode chip shown in FIG. 4A.

Referring to FIGS. 4A and 5, a submount 410 is provided with a plurality of light emitting diodes 420 formed thereon. Each light emitting diode 420 may comprise a substrate 422, a first semiconductor layer 424 with a first conductivity type, a light emitting layer 426, and a second semiconductor layer 428 with a second conductivity type. The light emitting layer 426 may be sandwiched between the first semiconductor layer 424 and the second semiconductor layer 428. The submount 410 may be print circuit board, ceramic submount, silicon submount, or metal submount. The substrate 422 may be made of, for example, sapphire.

As shown in FIG. 4A, a recess R may be formed in the light emitting diode 420, exposing portion of the first semiconductor layer 424. A first electrode P1 is formed over the portion of the first semiconductor layer 424 exposed in the recess R. A second electrode P2 is formed over the second semiconductor layer 424.

Figure 4B:
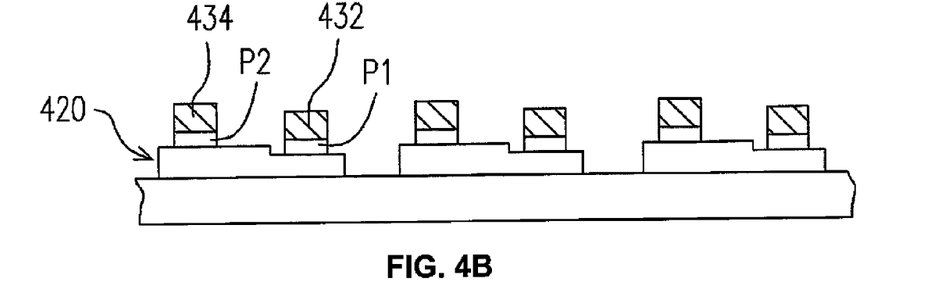

Next, referring to FIG. 4B, a first conductive bump 432 and a second conductive 434 are formed over the first electrode P1 and the second electrode P2, respectively. The top point of the first conductive bump 432 and that of the of the second conductive bump 434 may be kept at approximately the same height level.

Figure 4C:
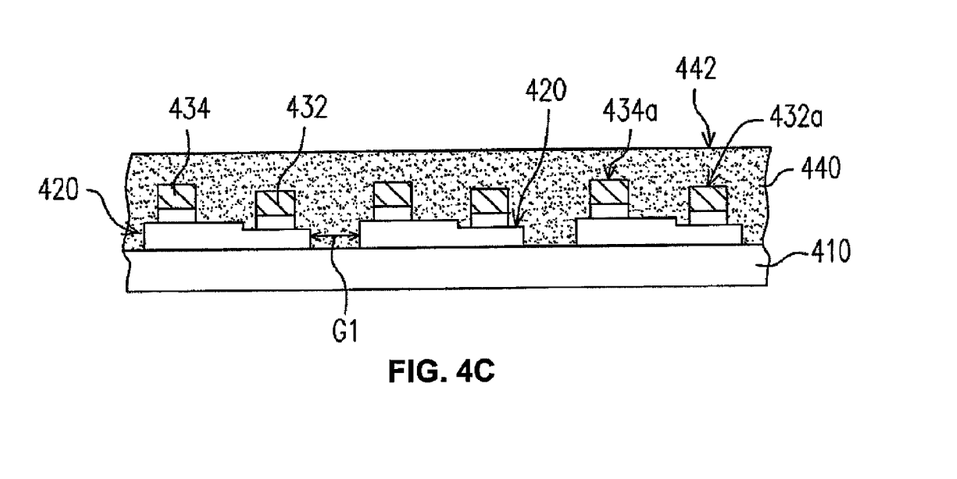

Referring to FIG. 4C, a phosphor coating layer 440 is then formed over the submount 410, the light emitting diode chips 420, the first conductive bumps 432 and the second conductive bumps 434. The phosphor coating layer 440 may fill the spaces G1 between the light emitting diode chips. In some embodiments, the phosphor coating layer 440 may be formed by, for example, transfer molding, compressing molding, screen printing, spin coating, dispensing, electrophoresis, spray coating, or any other suitable methods. The phosphor coating layer 440 may be a mixture of at least one type of phosphor powder and a resin. The resin may be, for example, silicone or epoxy resin.

Figure 4D:
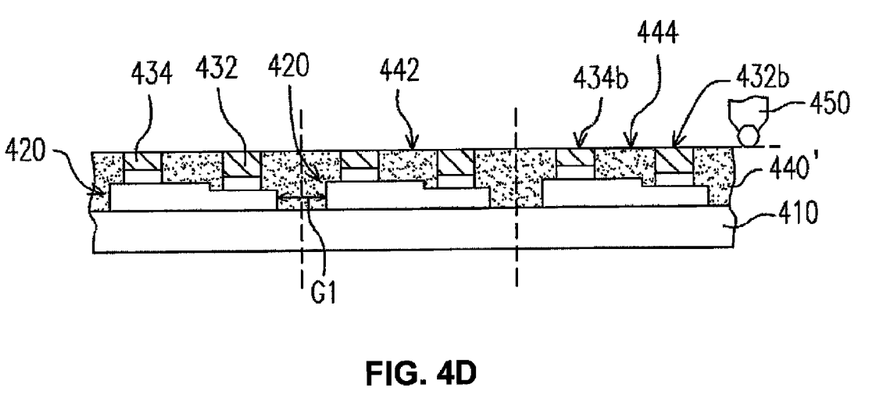

After forming, the phosphor coating layer 440 is subjected to curing. Then, as shown in FIGS. 4C and 4D, an upper portion of the cured phosphor coating layer 440' is removed by cutting the phosphor coating layer 440' using a point cutter, e.g., a diamond cutter 450, to reduce the thickness of the phosphor layer 440' so that the first conductive bumps 432 and the second conductive bumps 434 are exposed. In some embodiments, when cutting the phosphor coating layer 440', the diamond cutter 450 may also cut the first upper end portions 432a of the first conductive bumps 432 and the second upper end portions 434a of the second conductive bumps 434.

Consistent with the present invention, since the diamond cutter 450 may cut the phosphor coating layer 440', the first upper end portions 432a of the first conductive bumps 432, and the second upper end portions 434a of the second conductive bumps 434 at the same time, the upper surface 444 of the phosphor coating layer 440', the first upper surfaces 432b of the first conductive bumps 432, and the second upper surfaces 434b of the second conductive bumps 434 may be kept at substantially the same height level after the cutting step, as shown in FIG. 4D.

Consistent with principles of the present invention, since the diamond cutter 450 cuts the phosphor coating layer 440 in a rotation manner (same to that shown in FIGS. 2C, 3A, and 3B), the surface 444 of the phosphor coating layer 440' after cutting may have regular patterns. These patterns may help to reduce the total reflection of the light emitted from the light emitting diode chips 420 and/or that emitted by the phosphor coating layer 440' at the surface 444 of the phosphor coating layer 440', and thus may improve the extraction efficiency.

Figure 4E:
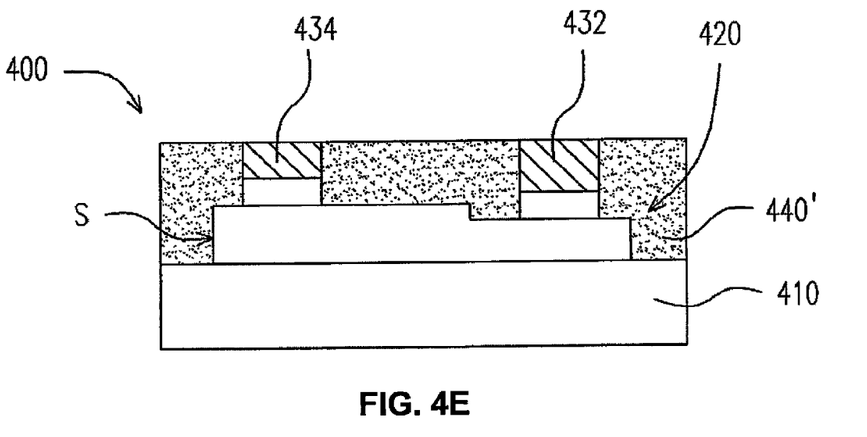

Then, referring to FIG. 4D, the phosphor coating layer 440' and the submount 410 are diced along the vertical dashed lines in the spaces G1 between the light emitting diode chips 420, so as to form a plurality of individual light emitting diode chips 400 having a phosphor coating layer. One of the light emitting diode chips 400 is shown in FIG. 4E. Consistent with principles of the present invention, different equipment may be used to dice the phosphor coating layer 440' and the submount 410. For example, the phosphor coating layer 440' and the submount 410 may be diced using a blade. Alternatively, the phosphor coating layer 440' may be diced using a blade, and the submount 410 may be diced using a laser. As another alternative, the phosphor coating layer 440' and the submount 410 may be diced using a laser.

In one embodiment, since the phosphor coating layer 440' is first formed over the light emitting diode chips 420 and then cutting is performed on the phosphor coating layer 440' to reduce its thickness, the phosphor coating layer thus formed on the light emitting diode chips may have a substantially uniform thickness. Therefore, the light emitted by the light emitting diode chip consistent with the present invention may have better uniformity.

In one embodiment, since the light emitting diode chips 420 are provided over the submount 410, the phosphor coating layer 440' may fully fill the space between the chips. Therefore, the phosphor coating layer may also be formed on the side surface S of the light emitting diode chip 420. The thickness of the phosphor coating layer formed on the side surface S may be controlled to be smaller than the thickness of the phosphor coating layer formed on the upper surface of the light emitting chip. Since the light emitted from the side surface S of the light emitting diode chip 420 is relatively weaker, thinner phosphor coating layer on the side surface may help to ensure better uniformity and higher brightness across the entire light emitting diode chip including the upper surface and the side surface.

In summary, an embodiment of the present invention may use a diamond cutter to cut the phosphor coating layer so as to reduce the thickness of the phosphor coating layer. The formed phosphor coating layer after cutting has very uniform thickness. Therefore, the light emitted from the light emitting diode chip having phosphor coating layer consistent with the present invention may have good uniformity. In another embodiment, since the ratio between the vertical thickness and the lateral thickness of the phosphor coating layer on the upper surface and the side surface, respectively, of the light emitting diode chip may be controlled, good light uniformity may be achieved across the entire light emitting diode chip. Moreover, since the surface of the phosphor coating layer after cutting may have regular patterns, the total reflection at the surface of the phosphor coating layer may be reduced, so that the extraction efficiency of the light emitting diode chip may be improved.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a plurality of light emitting diode chips having a substantially uniformly thick phosphor coating layer, comprising:
   providing a substrate having a plurality of light emitting diodes formed thereon;
   forming a conductive bump on at least one of the plurality of light emitting diodes;
   forming the phosphor coating layer over the substrate and the light emitting diodes;
   reducing a thickness of the phosphor coating layer for exposing the conductive bump; and
   separating a plurality of individual light emitting chips by dicing the phosphor coating layer and the light emitting diodes with a blade, and dicing the substrate with a laser.

2. The method of claim 1, wherein reducing the thickness of the phosphor coating layer is performed by cutting the phosphor coating layer with a point cutter.

3. The method of claim 2, wherein the point cutter is a diamond cutter or a Tungsten Carbide(WC) cutter.

4. The method of claim 2, wherein the point cutter cuts the upper portion of the phosphor coating layer in a horizontal direction.

5. The method of claim 2, further comprising cutting an upper portion of the conductive bump by the point cutter.

6. The method of claim 5, wherein, after cutting, an upper surface of the phosphor coating layer is substantially at the same level as an upper surface of the conductive bump.

7. The method of claim 2, wherein cutting the phosphor coating layer comprises:
   cutting the phosphor coating layer to remove a surface layer of the phosphor coating layer;
   checking whether the conductive bump is exposed; and
   if the conductive bump is not exposed, repeating the cutting step until the conductive bump is exposed.

8. The method of claim 2, wherein cutting the phosphor coating layer is performed by:
   rotating the point cutter about a rotation axis in a vertical direction; and
   moving the substrate relative to the point cutter in a horizontal direction.

9. The method of claim 2, wherein the step of cutting results in an upper surface of the phosphor coating layer having a rough surface with regular patterns.

10. The method of claim 1, wherein the phosphor coating layer is formed by one of transfer molding, compressing molding, screen printing, spin coating, dispensing, electrophoresis and spray coating.

11. The method of claim 1, wherein:
   the plurality of light emitting diodes comprises a plurality of light emitting diode dies formed separately on the substrate, and
   wherein the step of forming the phosphor coating layer further comprises filling a space between the dies.

* * * * *